United States Patent
Vice

(10) Patent No.: US 7,292,093 B2
(45) Date of Patent: Nov. 6, 2007

(54) ENVELOPE DETECTOR WITH DC LEVEL SHIFTING

(75) Inventor: Michael W. Vice, El Granada, CA (US)

(73) Assignee: Avago Technologies Wireless IP (Singapore) Pte. Ltd., Singapore (SG)

(*) Notice: Subject to any disclaimer, the term of this patent is extended or adjusted under 35 U.S.C. 154(b) by 328 days.

(21) Appl. No.: 10/924,699

(22) Filed: Aug. 24, 2004

(65) Prior Publication Data

US 2006/0046674 A1  Mar. 2, 2006

(51) Int. Cl.
*H03D 1/00* (2006.01)

(52) U.S. Cl. .................. 329/347; 329/365; 329/366; 455/214; 455/336

(58) Field of Classification Search ................ 329/347, 329/366, 365; 455/214, 336
See application file for complete search history.

(56) References Cited

U.S. PATENT DOCUMENTS 6,265,940 B1 * 7/2001 Adachi ....................... 330/140

* cited by examiner

*Primary Examiner*—Arnold Kinkead

(57) ABSTRACT

An envelope detector that does not generate an undesirable DC offset at its DC output signal. An envelope detector according to the present teachings includes a circuit for performing a DC level shift on an AC input signal applied to the envelope detector such that a magnitude of the DC level shift is proportional to a peak envelope of the AC input signal.

15 Claims, 3 Drawing Sheets

ENVELOPE DETECTOR WITH DC LEVEL SHIFTING

BACKGROUND

An envelope detector is an electronic circuit that may be used to detect an amplitude envelope of an AC input signal. For example, an envelope detector may generate a DC output signal that is proportional to an amplitude envelope of an RF input signal. Applications for envelope detectors include generating a feedback signal for controlling the power of an RF transmitter.

An envelope detector may generate a DC output signal by performing a half wave rectification on an AC input signal using a diode rectifier. A diode rectifier in an envelope detector may be biased so that it responds to a relatively small amplitude AC input signal. For example, a bias current may be applied to bias a diode rectifier at its threshold of conduction. Unfortunately, a bias current applied to the diode rectifier of an envelope detector may generate an undesirable DC offset in its DC output signal.

An external differential amplifier may be employed to subtract off the undesirable DC offset from the DC output signal of an envelope detector. For example, an envelope detector may include a dummy diode for generating a reference DC offset that mirrors the DC offset produced by the diode rectifier. A differential amplifier external to the envelope detector may then be used to subtract the reference DC offset from the DC output signal.

Unfortunately, a differential amplifier for subtracting a reference DC offset from a DC output signal may increase the overall cost of an envelope detector. In addition, an envelope detector implemented in an integrated circuit chip package may consume an additional input/output pin of the chip package to provide the reference DC offset to an external differential amplifier.

SUMMARY OF THE INVENTION

An envelope detector is disclosed that does not generate an undesirable DC offset at its DC output signal. An envelope detector according to the present teachings includes a circuit for performing a DC level shift on an AC input signal applied to the envelope detector such that a magnitude of the DC level shift is proportional to a peak envelope of the AC input signal.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
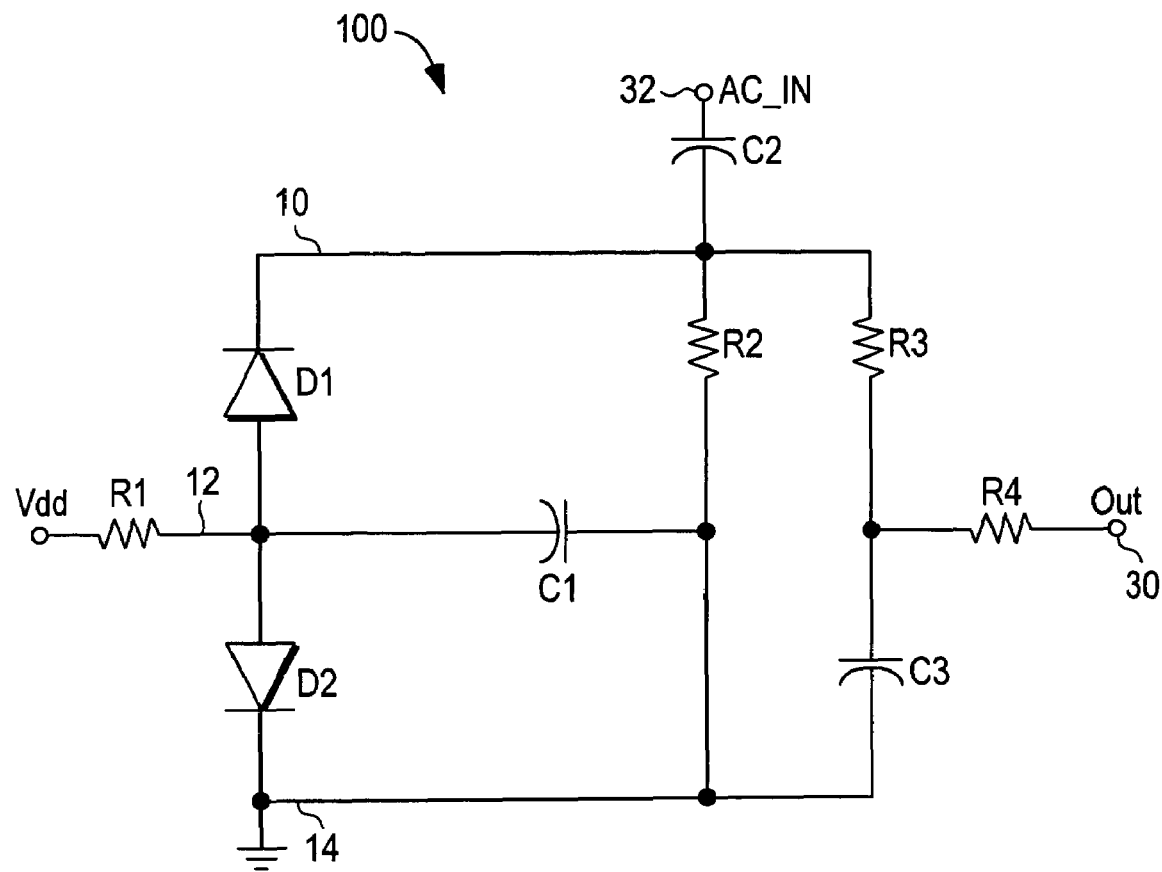
FIG. 1 shows an envelope detector according to the present teachings.

FIG. 1 shows an envelope detector 100 according to the present teachings. The envelope detector 100 generates a DC output signal at an output node 30 that is proportional to a peak envelope voltage of an AC input signal applied at an input node 32. In one embodiment, the AC input signal applied at the input node 32 is an RF signal.

The envelope detector 100 includes a pair of diodes D1 and D2. The diodes D1 and D2 are biased so that a DC voltage drop across the diode D1 between a pair of nodes 10 and 12 is substantially similar to a voltage drop across the diode D2 between the node 12 and a ground node 14 but of opposite polarity. The diode D1 is biased to its threshold of conduction by a bias current from a source voltage Vdd through a resistor R1, through the diode D1, through a resistor R2, and then to ground. The diode D2 is biased by a bias current from the source voltage Vdd through the resistor R1, through the diode D2, and then to ground.

The presence of the resistor R2 creates a small imbalance in the voltages dropped across the diodes D1 and D2. This imbalance may be mitigated by making the diode D2 larger than the diode D1. With the imbalance mitigated, the DC voltage drops across the diodes D1 and D2 are substantially equal in magnitude and opposite in polarity and therefore substantially cancel each other out.

The presence of a capacitor C1 across the diode D2 prevents an AC signal from appearing across the diode D2. This enables the diode D2 to compensate for the DC offset of the diode D1 without affecting the AC operation of the envelope detector 100. The anode of the diode D1 appears at ground from an AC perspective.

The AC input signal applied to the input node 32 is AC coupled to the diode D1 via a capacitor C2. The value of the capacitor C2 may be relatively small so as to sample only a small amount of the applied AC input signal, thereby avoiding excessive AC power loss in the diode D1.

The combination of the series capacitor C2 and the shunt diode D1 at the input node 32 performs the function of level shifting the DC component of the AC input signal at the input node 32. This DC shift is proportional to a peak envelope voltage of the AC input signal applied at the input node 32.

A resistor R3, a resistor R4, and a capacitor C3 provide a low pass filter that prevents an AC signal from reaching the output node 30. This low pass filter also isolates the RF circuitry in the envelope detector 100 from any reactive load on the output node 30.

Figure 2A:
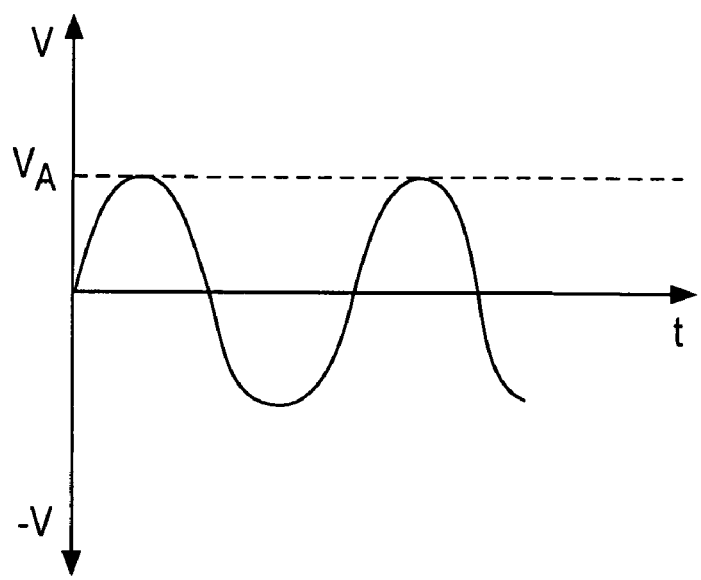
FIG. 2a shows an example AC input signal applied to an envelope detector.
Figure 2B:
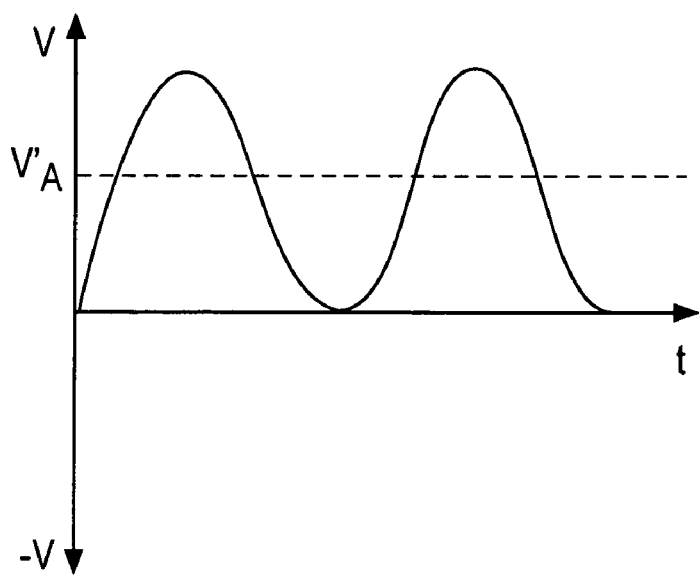
FIG. 2b shows a signal at an internal node of an envelope detector according to the present teachings in response to the example AC input signal.

FIG. 2a shows an example AC input signal applied to the node 32. The example AC input signal has a peak envelope voltage equal to $V_A$. FIG. 2b shows an AC signal at the node 10 in response to the example AC input signal. The capacitor C2 charges in response to the AC input signal applied to the node 32 such that the diode D1 does not draw substantial current at any part of the AC cycle. The charging of the capacitor C2 yields a DC component at the node 10 ($V_A'$) that is proportional to the peak envelope voltage $V_A$ of the AC input signal applied at the input node 32. The present method of level shifting in an envelope detector yields more detector gain in the DC output signal at the output node 30 in comparison to prior envelope detectors that employ half-wave rectifiers.

The operating characteristics of the diodes D1 and D2 track each other with variations in the temperature of the envelope detector 100. In addition, the operating characteristics of the diodes D1 and D2 track each other with variations in the process technology used to manufacture the envelope detector 100.

In an embodiment in which an RF input signal is applied at the input node 32 and the Vdd is 3V, circuit element values may be as follows: R1=15 k ohms, R2=25 k ohms, R3=10 k ohms, R4=1 k ohm, C1=1 pF, C2=0.25 pF, and C3=1 pF.

The arrangement shown in which the anodes of the diodes D1 and D2 are coupled to the node 12 generates a positive DC output voltage at the output node 30. In an alternative embodiment, the cathodes of the diodes D1 and D2 are coupled to the node 12 and Vdd is a negative voltage and a negative DC output voltage is generated at the output node 30.

Figure 3:
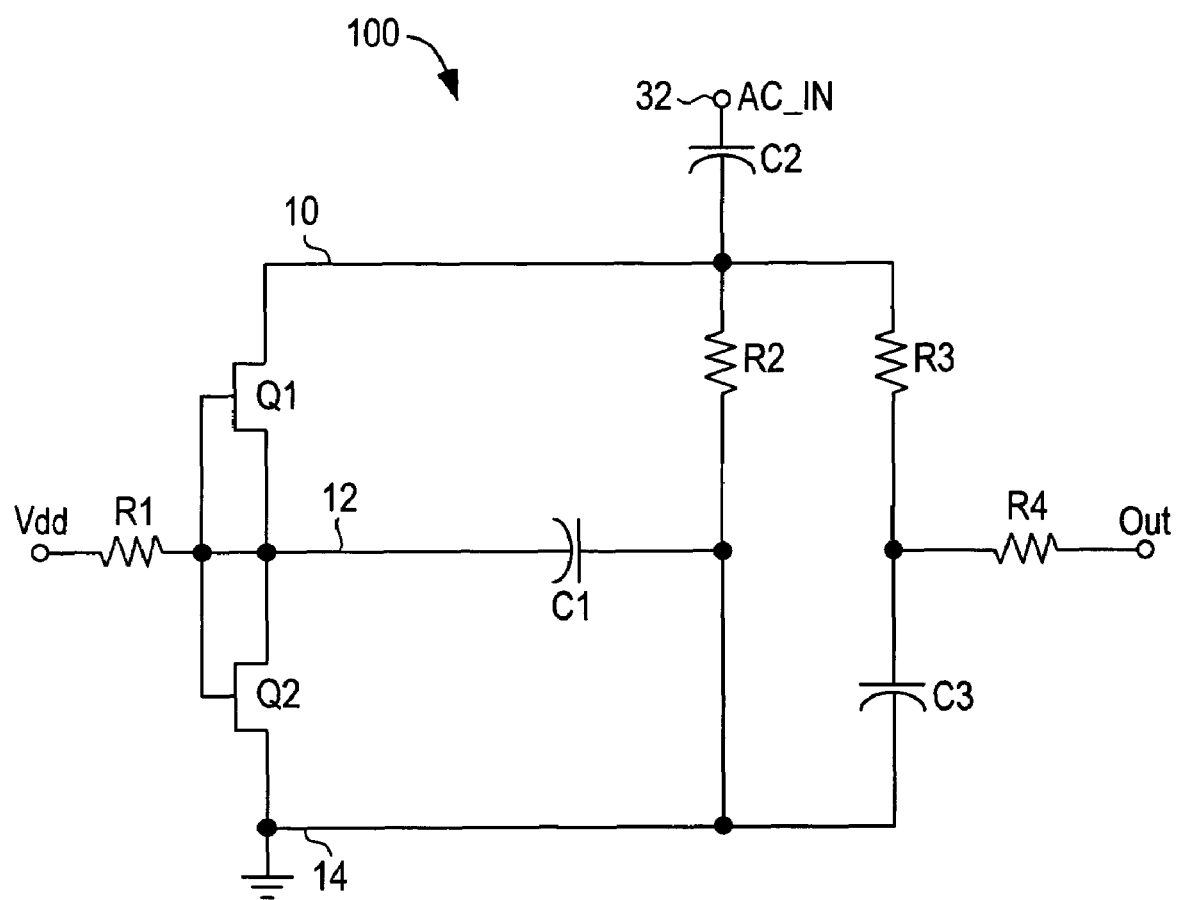
FIG. 3 shows another embodiment of an envelope detector according to the present teachings.

FIG. 3 shows another embodiment of the envelope detector 100 according to the present teachings. In this embodiment, the diodes D1 and D2 are implemented as a pair of diode-wired field-effect transistors Q1 and Q2, respectively. Alternatively, the diodes D1 and D2 may be implemented as a pair of diode-wired bipolar junction transistors.

In this embodiment, the presence of the resistor R2 creates an imbalance in the bias currents applied to the transistors Q1 and Q2. This imbalance may be mitigated by making the transistor Q2 larger than the transistor Q1. In one embodiment, the transistor Q2 has a gate width of 200 microns while the transistor Q1 has a gate width of 10 microns.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An envelope detector comprising a circuit for performing a DC level shift on an AC input signal applied to the envelope detector such that a magnitude of the DC level shift is proportional to a peak envelope of the AC input signal;
   wherein the circuit for performing a DC level shift comprises a series capacitor and a shunt diode;
   wherein the circuit further comprises:
   a first node for receiving the AC input signal;
   a second node, wherein the series capacitor is coupled between the first and the second nodes;
   a bias current source, wherein the shunt diode is coupled between the bias current source and the second node;
   a third node between the bias current source and the shunt diode; and
   a second diode coupled between the third node and ground.

2. The envelope detector of claim 1, wherein the series capacitor is selected to sample relatively a small amount of the AC input signal.

3. The envelope detector of claim 1, further comprising a low pass filter coupled to the circuit.

4. The envelope detector of claim 1, wherein the bias current source applies a bias current to the shunt diode and a bias current to the second diode.

5. An envelope detector comprising a circuit for performing a DC level shift on an AC input signal applied to the envelope detector such that a magnitude of the DC level shift is proportional to a peak envelope of the AC input signal, the envelop detector comprising:
   a DC level shifting circuit comprises a series capacitor and a shunt diode;
   a second diode, wherein the second diode is selected to be larger than the shunt diode; and
   a bias circuit for applying a bias current to the shunt diode and a bias current to the second diode.

6. The envelope detector of claim 1, wherein the second diode and the shunt diode are diode-wired transistors.

7. A method for envelope detection comprising performing a DC level shift on an AC input signal such that a magnitude of the DC level shift is proportional to a peak envelope of the AC input signal;
   wherein said performing a DC level shift comprises charging a series capacitor and a shunt diode that receive the AC input signal;
   wherein said performing a DC level shift comprises:
   coupling the AC input signal to a first node;
   coupling the series capacitor between the first node and a second node; and
   coupling the shunt diode between a bias current source and the second node;
   coupling a second diode between a third node and ground, wherein the third node is located between the bias current source and the shunt diode; and
   providing the second diode and the shunt diode by diode-wiring a pair of transistors.

8. The method of claim 7, further comprising selecting the series capacitor to sample relatively a small amount of the AC input signal.

9. The method of claim 7, further comprising low pass filtering an output signal from the circuit.

10. The method of claim 7, wherein the bias current source applies a bias current to the shunt diode and a bias current to the second diode.

11. A method for envelope detection comprising:
    performing a DC level shift on an AC input signal such that a magnitude of the DC level shift is proportional to a peak envelope of the AC input signal, wherein said performing a DC level shift comprises charging a series capacitor and a shunt diode that receive the AC input signal;
    coupling a second diode to the shunt diode;
    applying a bias current to the shunt diode and a bias current to the second diode; and
    selecting the second diode to be larger than the shunt diode.

12. The envelope detector of claim 1, further comprising:
    a second capacitor coupled between the second and the third nodes.

13. The envelope detector of claim 12, further comprising:
    a resistor between the second node and the second capacitor, wherein the second diode is larger than the shunt diode.

14. The method of claim 7, further comprising:
    coupling a second capacitor between the second and the third nodes.

15. The method of claim 14, further comprising:
    coupling a resistor between the second node and the second capacitor, wherein the second diode is larger than the shunt diode.

* * * * *